(12) United States Patent
Koyama

(10) Patent No.: US 7,683,669 B2
(45) Date of Patent: Mar. 23, 2010

(54) SEMICONDUCTOR DEVICE, CPU, IMAGE PROCESSING CIRCUIT AND ELECTRONIC DEVICE, AND DRIVING METHOD OF SEMICONDUCTOR DEVICE

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 356 days.

(21) Appl. No.: 11/739,150

(22) Filed: Apr. 24, 2007

(65) Prior Publication Data

US 2007/0187684 A1 Aug. 16, 2007

Related U.S. Application Data

(63) Continuation of application No. 10/800,035, filed on Mar. 15, 2004, now Pat. No. 7,307,317.

(30) Foreign Application Priority Data

Apr. 4, 2003 (JP) ............................. 2003-102101

(51) Int. Cl.
*H01L 27/01* (2006.01)
*H03K 19/0175* (2006.01)
(52) U.S. Cl. ............................. 326/82; 326/31; 257/347
(58) Field of Classification Search ................. 326/82, 326/31, 34; 257/66, 347, 365
See application file for complete search history.

(56) References Cited

U.S. PATENT DOCUMENTS

| | | | |
|---|---|---|---|
| 4,591,848 A | 5/1986 | Morozumi | |
| 5,132,819 A | 7/1992 | Noriyama | |
| 5,457,474 A | 10/1995 | Ikeda | |
| 5,461,338 A | 10/1995 | Hirayama et al. | |
| 5,477,073 A | 12/1995 | Wakai | |
| 5,552,637 A | 9/1996 | Yamagata | |
| 5,644,147 A | 7/1997 | Yamazaki | |
| 5,680,264 A | 10/1997 | Yamagishi | |
| 5,807,772 A | 9/1998 | Takemura | |
| 5,814,834 A | 9/1998 | Yamazaki | |
| 5,818,070 A | 10/1998 | Yamazaki | |

(Continued)

FOREIGN PATENT DOCUMENTS

CN  1406096  3/2003

(Continued)

OTHER PUBLICATIONS

Office Action (Chinese Application No. 200410034252.2, Mar. 9, 2007) with English translation.

*Primary Examiner*—Daniel D Chang
(74) *Attorney, Agent, or Firm*—Fish & Richardson P.C.

(57) ABSTRACT

The invention provides a semiconductor device which consumes less power in pending. The invention further provides a semiconductor device in which a gate electrode is provided over both sides of a semiconductor thin film which forms a transistor, a logic signal is applied to a first gate electrode, a threshold value control signal is applied to a second gate electrode, and a threshold value of a transistor which forms the semiconductor device is controlled by a potential of the second gate electrode, and a driving method thereof. Then, the invention provides a semiconductor device provided with a plurality of logic circuits formed of such a transistor with a back gate and a driving method thereof.

18 Claims, 13 Drawing Sheets

U.S. PATENT DOCUMENTS

| | | |
|---|---|---|
| 5,821,137 A | 10/1998 | Wakai |
| 5,834,797 A | 11/1998 | Yamanaka |
| 5,874,851 A * | 2/1999 | Shiota .................. 327/537 |
| 5,917,221 A | 6/1999 | Takemura |
| 5,956,011 A | 9/1999 | Koyama |
| 6,010,923 A | 1/2000 | Jinno |
| 6,037,924 A | 3/2000 | Koyama |
| 6,072,193 A | 6/2000 | Ohnuma |
| 6,081,131 A | 6/2000 | Ishii |
| 6,150,283 A | 11/2000 | Ishiguro |
| 6,153,893 A | 11/2000 | Inoue |
| 6,197,624 B1 | 3/2001 | Yamazaki |
| 6,198,133 B1 | 3/2001 | Yamazaki |
| 6,204,519 B1 | 3/2001 | Yamazaki |
| 6,207,971 B1 | 3/2001 | Jinno |
| 6,285,248 B1 | 9/2001 | Hiratsuka |
| 6,342,717 B1 | 1/2002 | Komatsu |
| 6,388,509 B2 | 5/2002 | Hiratsuka |
| 6,392,628 B1 | 5/2002 | Yamazaki |
| 6,462,723 B1 | 10/2002 | Yamazaki |
| 6,512,271 B1 | 1/2003 | Yamazaki |
| 6,555,482 B2 | 4/2003 | Skotnicki |
| 6,569,716 B1 | 5/2003 | Suzuki |
| 6,603,453 B2 | 8/2003 | Yamazaki |
| 6,608,613 B2 | 8/2003 | Koyama |
| 6,842,396 B2 | 1/2005 | Kono |
| 6,967,522 B2 * | 11/2005 | Chandrakasan et al. ..... 327/534 |
| 6,973,584 B2 | 12/2005 | Na |
| 6,990,572 B2 | 1/2006 | Ando |
| 2004/0207011 A1 | 10/2004 | Iwata et al. |
| 2005/0158929 A1 | 7/2005 | Yamazaki |

FOREIGN PATENT DOCUMENTS

| | | |
|---|---|---|
| JP | 7-74282 | 3/1995 |
| JP | 2002-041160 | 2/2002 |

* cited by examiner

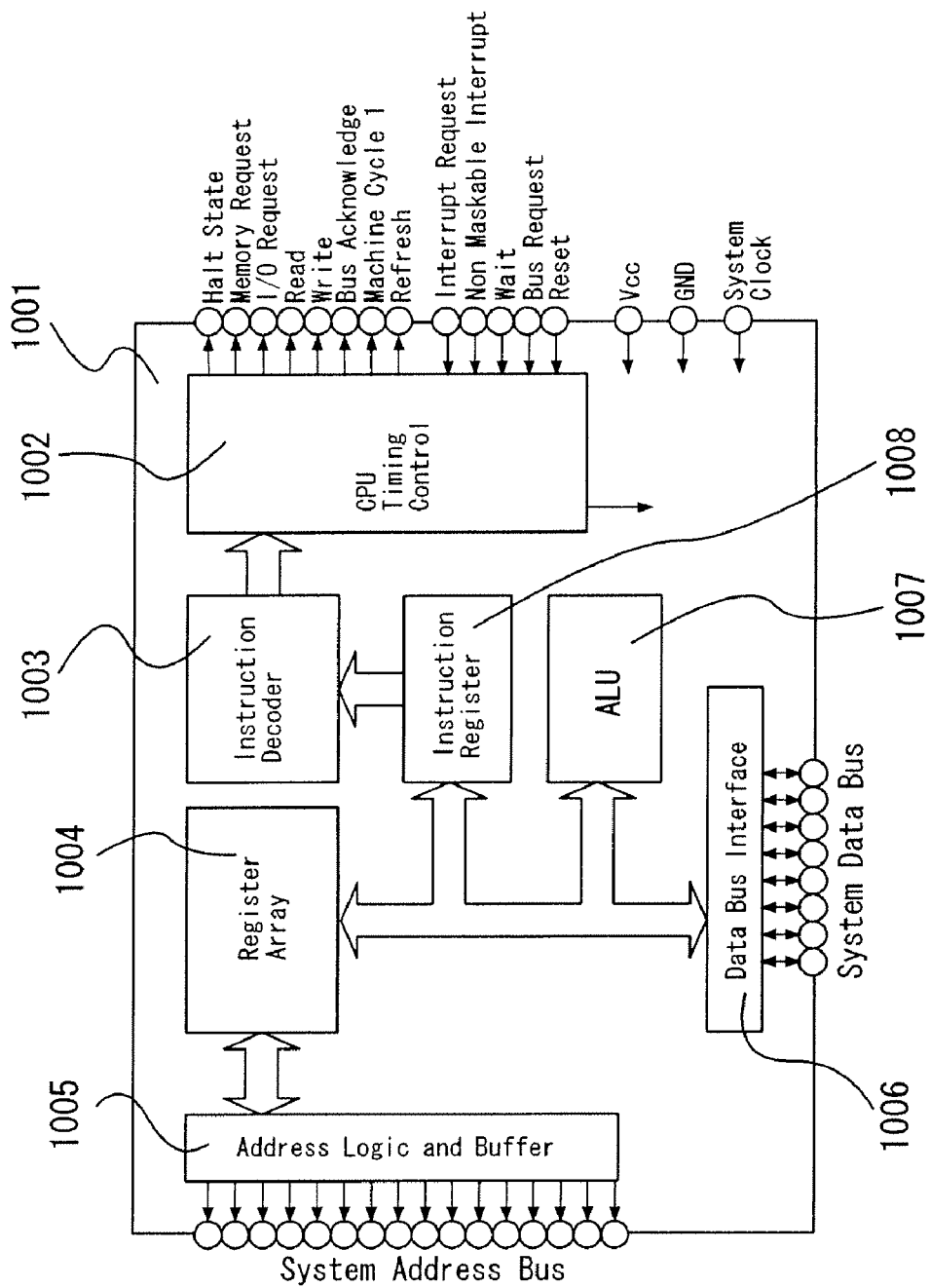
FIG. 10 —Prior Art—

SEMICONDUCTOR DEVICE, CPU, IMAGE PROCESSING CIRCUIT AND ELECTRONIC DEVICE, AND DRIVING METHOD OF SEMICONDUCTOR DEVICE

TECHNICAL FIELD

The present invention relates to a semiconductor device, and more particularly to a semiconductor device formed of a thin film semiconductor element and an electronic device including a semiconductor device. Moreover, the invention relates to a driving method of a semiconductor device.

BACKGROUND ART

In recent years, a portable phone is widespread with the advance of communications technology. It is expected that a moving image will be transferred and more amount of information will be transmitted in the days ahead. Meanwhile, a personal computer for mobile use is produced due to the weight reduction. An information terminal which is called a PDA originated in an electronic data book is produced a lot and being widespread. In those portable information devices, a lot of semiconductor devices such as a CPU (Central Processing Unit) are used.

There are various kinds of semiconductor devices. FIG. 10 shows a block diagram of a CPU as an example. A CPU 1001 shown here is formed of a timing control circuit 1002, an instruction analysis decoder 1003, a register array 1004, an address logic buffer circuit 1005, a data bus interface 1006, an ALU 1007, an instruction register 1008 and the like.

Now, each circuit is briefly described. The timing control circuit receives an instruction externally, converts it into data for internal use, and sends it to other blocks. Further, in accordance with an internal operation, the timing control circuit gives an external portion an instruction such as a read and write of memory data. The instruction analysis decoder 1003 plays a role to convert an external instruction into an instruction for internal use. The register array 1004 is a volatile memory which stores data temporarily. The address logic buffer 1005 is a circuit which specifies an address of an external memory. The data bus interface 1006 is a circuit which puts data into and out of a device such as an external memory or a printer. The ALU 1007 is a circuit which provides an arithmetic operation. The instruction register 1008 is a circuit which stores an instruction temporarily. A CPU is formed by a combination of such circuits.

A semiconductor device such as a CPU these days use an insulator for a substrate instead of a silicon substrate. Such a semiconductor device is called an SOI (Silicon On Insulator) and presently being developed. By using an insulator as a substrate, a parasitic capacitance between a transistor and the substrate is reduced, thus a high speed and a power reduction can be achieved. In particular, it is used for a portable electronic device by virtue of the power reduction. An electronic device using a semiconductor device which consumes much power has problems that a large battery and a cooling fan are required, leading to a problem that an electronic device itself becomes large.

In view of the aforementioned, a composite type semiconductor device is suggested which has a structure that a wiring substrate and a package are attached so as to satisfy a high thermal conductivity and low modulus.

[Patent Document 1]
Japanese Patent Laid-Open No. Hei 7-74282

Moreover, FIG. 11 shows an example of a circuit having two stages of inverters of a semiconductor device using a conventional silicon substrate. In this example, the inverter circuits are formed of P-ch transistors 1102 and 1104, and N-ch transistors 1101 and 1103.

FIG. 12 shows an example of a circuit having two stages of inverters of a semiconductor device using an SOI substrate. In this example, the inverter circuits are formed of P-ch transistors 1202 and 1204, and N-ch transistors 1201 and 1203.

DISCLOSURE OF THE INVENTION

Problems to be Solved by the Invention

An SOI as described above is quite an efficient means for power saving of a portable electronic device, however, a following problem still remains.

FIG. 13 is a chart showing a relationship of a drain current and a gate voltage of an N-type MOS transistor. It is desirable that a drain current Id is sufficiently large in a region in which a gate voltage Vg is positive and the drain current Id is 0 when the gate voltage Vg is equal to or less than 0. In fact, however, the drain current Id has a leakage current as much as IL even when the gate voltage Vg is 0 as shown by a curve 1301. As a present LSI is provided with millions of transistors, a sum of leakage currents of them can never be small although a current of each transistor is not large. Such a leakage current can cause an increase in power consumption of a semiconductor device in pending.

By adding a slight amount of impurity to a channel region of a transistor, a curve shown in FIG. 13 shifts to right a little, thus the leakage current can be reduced. In that case, however, a current is decreased in the case where Vg is positive also, therefore, it is a problem that a frequency characteristic of a circuit is decreased.

Moreover, a semiconductor region touching the bottom side of a channel in a conventional semiconductor device using a silicon substrate is connected to GND or a power supply and applied a fixed potential. Therefore, an Id-Vg curve is fixed and a problem as described above occurs. In a circuit shown in FIG. 12, a semiconductor region touching the bottom side of a channel in a semiconductor device using an SOI substrate is either floating or does not exist. Therefore, the Id-Vg curve is fixed and a problem as described above occurs after all.

In view of the aforementioned problems, the invention provides a semiconductor device of which power consumption due to a leakage current is small, a driving method thereof, and an electronic device using it.

Means for Solving the Problems

In order to solve the aforementioned problems, the invention provides a semiconductor device in which a gate electrode is provided over both sides of a semiconductor thin film which forms a transistor, and a driving method thereof. A logic signal is applied to a first gate electrode and a threshold value control signal is applied to a second gate electrode, and a threshold value of a transistor which forms the semiconductor device is varied by a potential of the second gate electrode. Further, the invention provides a semiconductor device provided with a plurality of logic circuits formed of such a transistor with a back gate and a driving method of it. That is, power consumption due to a leakage current becomes a problem when a state of a transistor does not change much in many periods. Such a state is obtained a lot in a pending mode. On the other hand, in a period in which a circuit operates frequently, power consumption is dependent on an on-characteristic of a transistor, thus a leakage current can be ignored. Such a mode is called an active mode.

A distinction of such a pending mode and an active mode is controlled by a detection means (for example, a program) for controlling a threshold value control circuit. By using this detection means and the threshold value control circuit, a threshold value of a transistor can be changed. Therefore, as a threshold value of a transistor can be set high in pending, a power consumption due to a leakage current can be reduced.

The invention comprises a logic circuit provided with a thin film transistor over an insulating surface and a detection means which detects an operating frequency of the logic circuit and outputs the detection result to a threshold value control circuit, in which the thin film transistor comprises a first gate electrode inputted with a logic signal and a second gate electrode inputted with a threshold value control signal from the threshold value control circuit, and an amount of current flowing between a source electrode and a drain electrode of the thin film transistor is controlled by the threshold value control signal. A semiconductor thin film is provided over the second gate electrode and the first gate electrode is provided over the semiconductor thin film.

The invention comprises a logic circuit provided with a thin film transistor over an insulating surface and a storage medium storing a program for functioning as a detection means which detects an operating frequency of the logic circuit and outputs the detection result to a threshold value control circuit, in which the thin film transistor comprises a first gate electrode inputted with a logic signal and a second gate electrode inputted with a threshold value control signal from the threshold value control circuit, and an amount of current flowing between a source electrode and a drain electrode of the thin film transistor is controlled by the threshold value control signal.

Further, the aforementioned semiconductor device is a CPU or an image processing circuit.

The invention comprises a logic circuit provided with a thin film transistor over an insulating surface and a detection means which detects an operating frequency of the logic circuit and outputs the detection result to a threshold value control circuit, in which the detection means discriminates between a pending mode and an active mode and the threshold value control circuit outputs to the logic circuit the threshold value control signal to raise a threshold value of the thin film transistor when the detection means discriminates the pending mode.

As described above, according to the invention, a threshold value of a transistor can be set high in pending and a leakage current can be reduced. Accordingly, a battery can be small in size, thus an electronic device which is small, lightweight, and consumes less power can be realized.

EFFECT OF THE INVENTION

According to the invention, a back gate is provided to a transistor and its back gate voltage is controlled by a detection means (a storage medium storing a program), thus a power consumption in pending is reduced. Accordingly, a battery can be small in size and an electronic device which has a small volume can be realized. A small size, lightweight, and thin design can be realized.

BEST MODE FOR CARRYING OUT THE INVENTION

Embodiment Modes of the invention are described with reference to the drawings. Although the present invention will be fully described by way of example with reference to the accompanying drawings, it is to be understood that various changes and modifications will be apparent to those skilled in the art. Therefore, unless such changes and modifications depart from the scope of the invention, they should be construed as being included therein.

FIG. 1 is a semiconductor device using the invention. There are various kinds of semiconductor devices. A block diagram of a CPU is shown in FIG. 1 as an example of them. A CPU 101 shown here is formed of a timing control circuit 102, an instruction analysis decoder 103, a register array 104, an address logic buffer circuit 105, a data bus interface 106, an ALU 107, an instruction register 108 and the like. The aforementioned are the same as a conventional example, however, a threshold value control circuit 109 is added in the block diagram in FIG. 1. The threshold value control circuit supplies a threshold value control signal to other logic circuits.

The threshold value control signal is sent to a transistor which varies a threshold value. Description is made with reference to an example of two stages of inverter circuits in FIG. 2. In this example, inverter circuits are formed of P-ch transistors 202 and 204, and N-ch transistors 201 and 203. The invention is different from a conventional example in the respect that a transistor with a back gate having gate electrodes over both sides of a channel is used, a logic signal is applied to a first gate electrode and a threshold value control signal is applied to a second gate electrode. The threshold value control signal is supplied through a P-ch threshold value control line and an N-ch threshold value control line.

FIG. 3 shows an Id-Vg characteristic of a transistor having a first and a second gate electrodes. FIG. 3 shows three kinds of curves 301 to 303 in which the curve 302 is the one obtained when a fixed positive voltage is applied to the second gate electrode. In such a case, the curve shifts to left, allowing more current to flow. The curve 301 is obtained in the case of applying a voltage of 0 to the second gate electrode. Such a case is the same as a conventional example. The curve 303 is the one obtained when a negative voltage is applied to the second gate electrode. In such a case, the curve shifts to right and it becomes hard for the current to flow and a leakage current is decreased as well. By providing a threshold value control function to an inverter circuit to shift the Id-Vg curve, a leakage current can be decreased.

Next, an operating method thereof is described with reference to FIG. 4. The semiconductor device of the invention has a detection means (for example, a program, a storage medium storing a program, or a software) for controlling a threshold value of a transistor. The detection means is formed of a program for detecting an operating frequency of a semiconductor device (logic circuit) and a program for operating the threshold value control circuit by invoking data for controlling the threshold value from within the semiconductor device or an external memory when the detection exceeds a certain level.

The operating frequency detecting program counts the number of times a certain instruction is used within a certain period of time, and the operating frequency can be detected according to the count. That is, the number of times used in a certain period of time being set, it is determined to be a first mode when the detected number in that period is equal to or less than a certain value, while it is determined to be a second mode when the detected number exceeds a certain value. It is needless to say that the determination method is not limited to this. Here, provided that the first mode is the pending mode and the second mode is the active mode, determination can be performed in the pending time and the active time, with which the threshold value is controlled.

In this manner, by controlling the threshold value control circuit by providing the threshold value control circuit within a semiconductor device and detecting a mode of the semiconductor device by a detection means, a power consumption of the semiconductor device can be suppressed low according to the circumstance.

The semiconductor device of this embodiment mode can be used as a CPU, an image processing device and the like.

EMBODIMENT

Embodiment 1

FIG. 5 is a cross sectional view of a thin film transistor which forms the semiconductor device of the invention. Description on the manufacturing steps thereof follows. A base film 502 is formed over an insulating substrate 501 and second gate electrodes 503 and 504 are formed thereon. Subsequently, a gate insulating film 505 for the second gate electrode is formed and semiconductor thin film regions 506 and 507 are formed thereon. Next, gate insulating films 508 and 509 for the first gate electrode are formed and first gate electrodes 510 and 511 are formed thereon. After forming a source-drain region by adding a P-type impurity and an N-type impurity, an interlayer film 512 is formed, a contact hole is opened, and source-drain electrodes 513, 514, and 515 are formed. In this manner, a transistor having a back gate can be formed.

The invention is not limited to this embodiment and can be applied to the one having other shapes or made through other manufacturing steps.

Embodiment 2

FIG. 6 shows an embodiment of the threshold value control circuit. In this embodiment, there are a plurality of circuits to be controlled in threshold values in a semiconductor device and they are controlled independently. The threshold value control circuit of this embodiment is formed of memory circuits 603, 606, and 609 for storing data for controlling from a data bus, A/D converter circuits 602, 605, and 608 which converts the stored data into an analog voltage, and buffer circuits 601, 604, and 707 which buffer output the analog voltage. Output voltages of the buffer circuits are connected through threshold value control lines to second gate electrodes of each circuit to control a threshold value of a transistor. In this embodiment, though a plurality of threshold value control circuits are provided for controlling a plurality of circuits independently, the invention is not limited to this and only one threshold value control circuit may be provided as well.

Embodiment 3

A method for driving the threshold value control circuit is specifically described with reference to FIG. 7. FIG. 7 shows an address comparator 701, an address memory 702, a counter 703, a reset signal generating circuit 704, a discrimination circuit 705, a discrimination reference value memory 706 and a threshold value control circuit 707. The address comparator is connected to an address bus and inputted with address data. The address data stored in the address memory is also inputted. It compares these two data and when they match, outputs a signal indicating the match to the counter 703.

The counter 703 counts an output of the address comparator 701. At this time, a reset signal is inputted regularly from the reset signal generating circuit 704. Provided that the reset signal is inputted once in 0.01 second, the counter 703 counts the number of times data of the address memory 702 and data of the address bus match. The time is not limited to 0.01 second and may be other time as well.

The discrimination circuit 705 compares an output of the counter 703 and data of the discrimination reference value memory 706 and operates the threshold value control circuit 707 so as to lower the threshold value in the case where the output value of the counter 703 is larger than the value of the discrimination reference value memory 706. Further, the threshold value control circuit 707 is operated so as to raise the threshold value in the case where the output value of the counter 703 is smaller than the value of the discrimination reference value memory 706.

In FIG. 7, the address memory 702, the discrimination reference value memory 706 may be a fixed memory such as a mask ROM, a rewritable non-volatile memory such as an EEPROM, or a volatile memory such as an SRAM which stores data as required.

FIG. 8 shows a circuit diagram of an address comparator. FIG. 8 shows an example of 4-bit for simplicity, however, it is not limited to 4-bit. A value of each bit of an address bus 802 and an address memory 801 is inputted to EXORs 803 to 806 and outputs of the EXORs 803 to 806 are inputted to a NOR 807. In FIG. 8, a latch circuit 808 is connected to an output of the NOR 807 for preventing a glitch and the like in switching operations, however, this is not necessarily provided. With a latch pulse, data after switching is latched.

The counter 803 may be a known counter with a reset terminal. The reset signal generating circuit 804 is only required to divide a signal having a fixed frequency such as a clock signal into as many as required. The discrimination circuit 805 is only required to subtract a value of the discrimination reference value memory 806 from an output of the counter 803 and operate the threshold value control circuit 807 at the points when a difference thereof changes from plus to 0 and when it changes from minus to 0. Also, the threshold value control circuit 807 is only required to be operated at the points when the difference changes from 0 to minus and when it changes from 0 to plus.

Embodiment 4

The semiconductor device of the invention can be used to various electronic devices. Electronic devices having the semiconductor device of the invention are described below.

Such electronic devices include a video camera, a digital camera, a head mounted display (goggle type display), a game machine, a car navigation system, a personal computer, a portable information terminal (mobile computer, portable phone, electronic book or the like) and the like. Examples of these are shown in FIG. 7.

FIG. 9A illustrates a digital camera including a main body 9101, a display portion 9102, an image receiving portion 9103, operating keys 9104, an external connecting port 9105, a shutter 9106 and the like. By using the semiconductor device of the invention to a control circuit, an image processing circuit and the like of a camera, a digital camera which is small in size and consumes less power can be obtained.

FIG. 9B illustrates a notebook personal computer including a main body 9201, a housing 9202, a display portion 9203, a keyboard 9204, an external connecting port 9205, a pointing mouse 9206 and the like. By using the semiconductor device of the invention to a CPU and the like, a notebook personal computer which is small in size and consumes less power can be obtained.

FIG. 9C illustrates a portable information terminal including a main body 9301, a display portion 9302, a switch 9303, operating keys 9304, an infrared port 9305 and the like. By using the semiconductor device of the invention to a CPU, an image processing circuit and the like, a portable information terminal which is small in size and consumes less power can be obtained.

FIG. 9D illustrates an image reproducing device provided with a recording medium (specifically a DVD reproducing device), including a main body 9401, a housing 9402, a recording medium (CD, LD, DVD or the like) reading portion 9405, an operating switch 9406, a display portion a9403, a display portion b9404 and the like. The display portion a mainly displays image data while the display portion b mainly display text data. By using the semiconductor device of the invention to an image processing circuit and the like of an image reproducing device provided with a recording medium, an image reproducing device which is small in size and consumes less power can be obtained. Note that the invention can be used to a CD reproducing device, a game machine and the like as an image reproducing device provided with a recording medium.

FIG. 9E illustrates a folding portable display device. By using a CPU and the like using the invention to a main body 9501, a portable display device which is small in size and consumes less power can be obtained.

FIG. 9F illustrates a video camera of which main body 9601 includes a display portion 9602, a housing 9603, an external connecting port 9604, a remote control receiving portion 9605, an image receiving portion 9606, a battery 9607, an audio input portion 9608, an ocular portion 9609, operating keys 9610 and the like. By using the semiconductor device of the invention to an image processing circuit and the like, a video camera which is small in size and consumes less power can be obtained.

FIG. 9G illustrates a portable phone including a main body 9701, a housing 9702, a display portion 9703, an audio input portion 9704, an antenna 9705, an operating key 9706, an external connecting port 9707, and the like. By using the semiconductor device of the invention to a CPU and the like, a portable phone which is small in size and consumes less power can be obtained.

As described above, an application range of the invention is quite wide and the invention can be applied to electronic devices of various fields. Further, the electronic devices described in this embodiment can be realized by using any configuration in any combination of the embodiment mode and Embodiments 1 and 2.

BRIEF DESCRIPTION OF THE DRAWINGS

FIG. 10 is a diagram showing a conventional semiconductor device.

Figure 1:
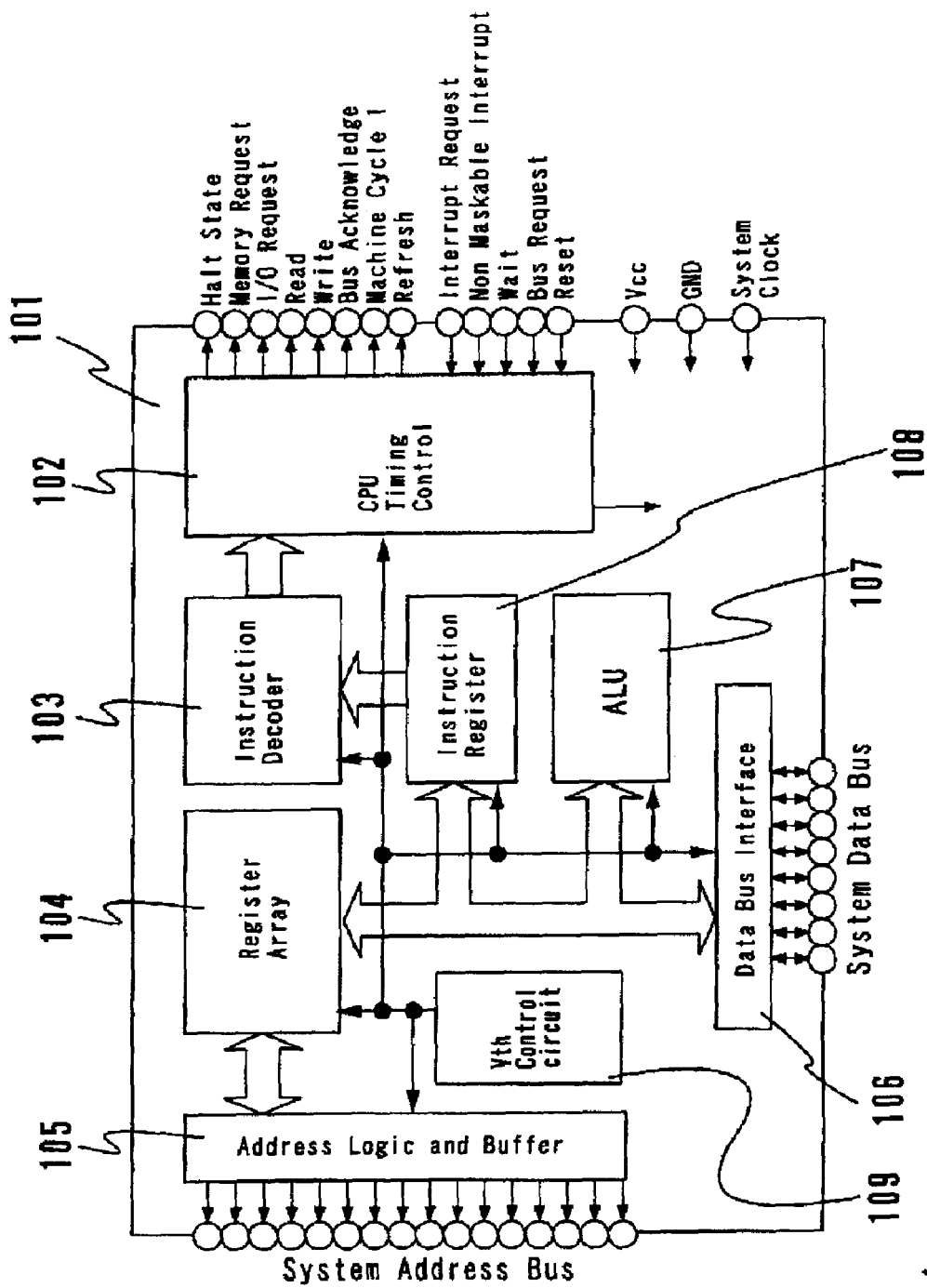
FIG. 1 is a diagram showing the semiconductor device of the invention.
Figure 2:
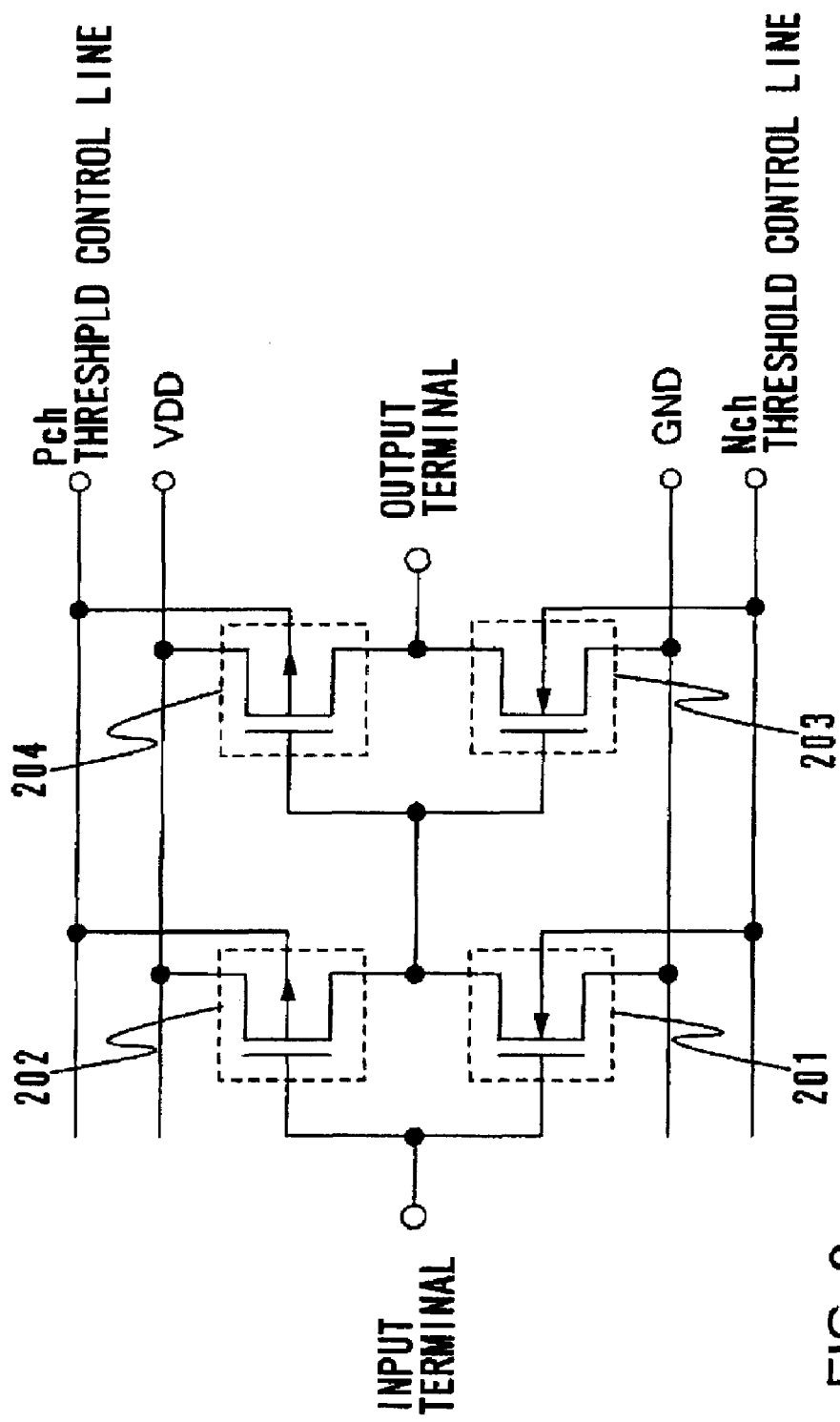
FIG. 2 shows an inverter circuit of the semiconductor device of the invention.
Figure 3:
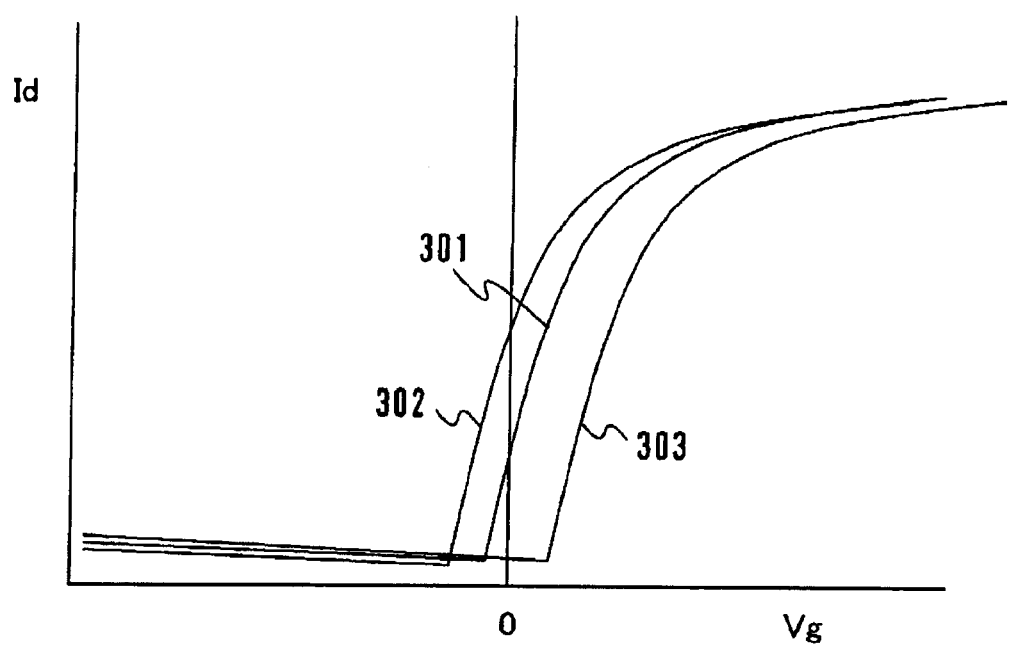
FIG. 3 shows a drain current characteristic of a transistor used in the semiconductor device of the invention.
Figure 4:
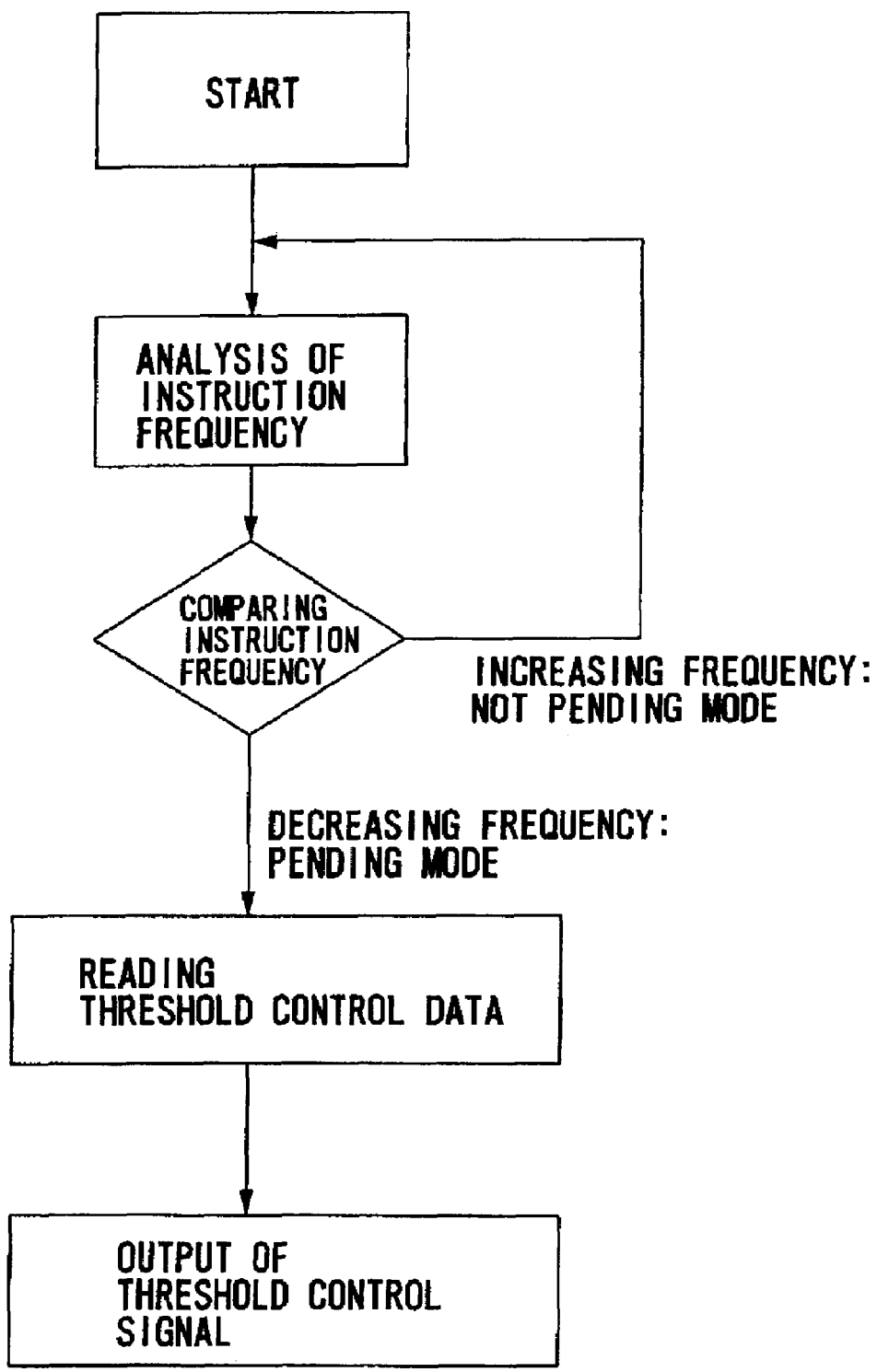
FIG. 4 shows a detection means used in the semiconductor device of the invention.
Figure 5:
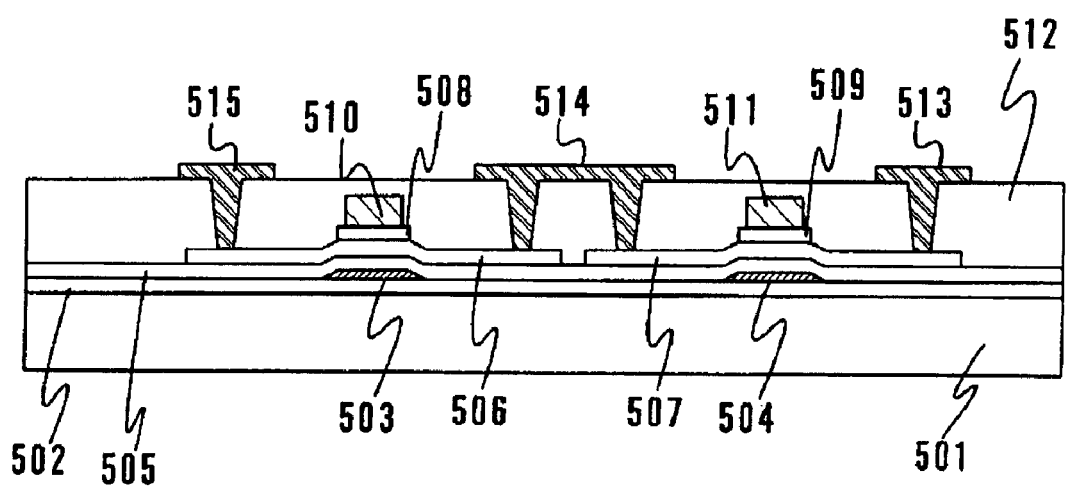
FIG. 5 is a cross sectional view of the semiconductor device of the invention.
Figure 6:
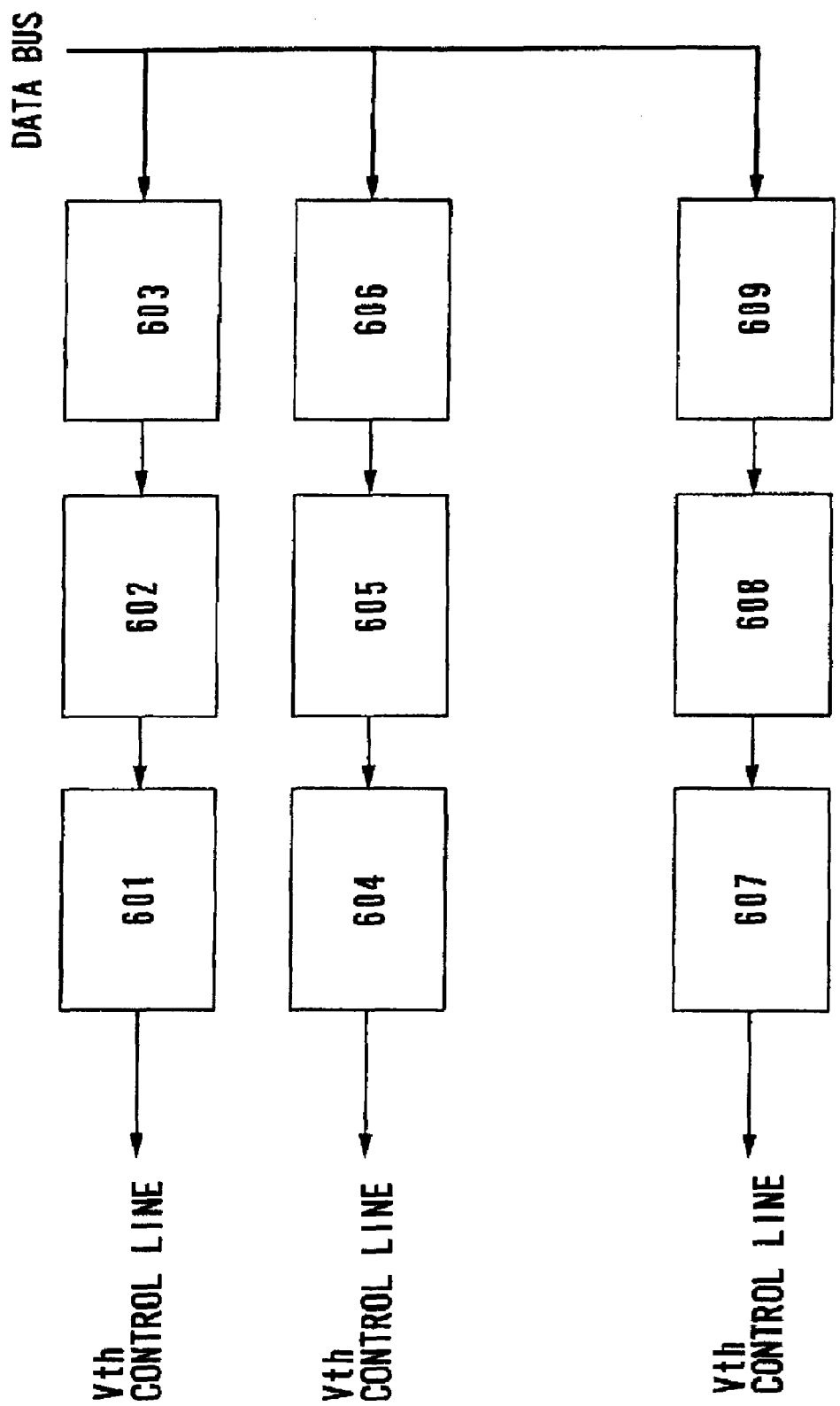
FIG. 6 shows the threshold value control circuit of the invention.
Figure 7:
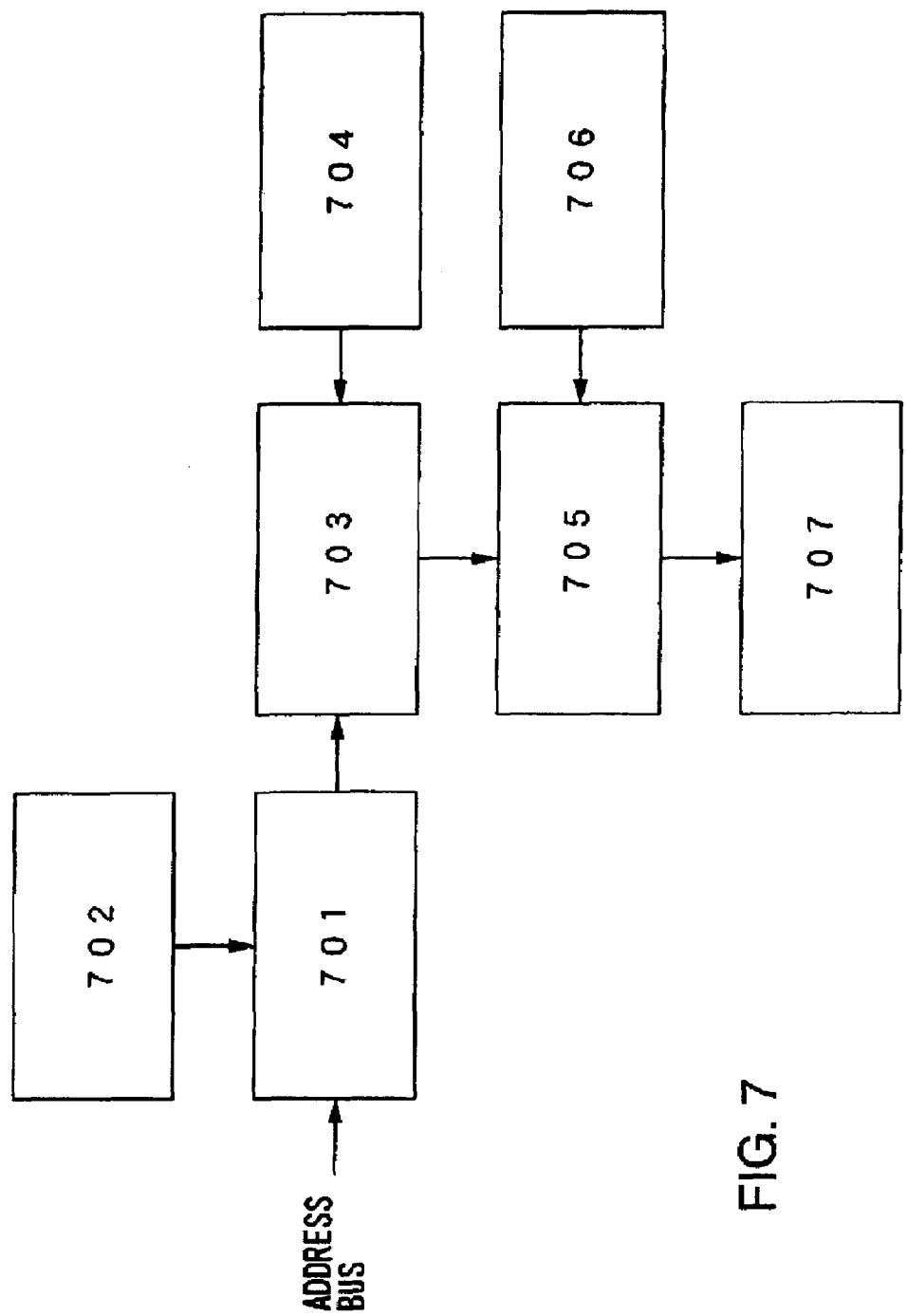
FIG. 7 is diagram showing a driving method of the threshold value control circuit of the invention.
Figure 8:
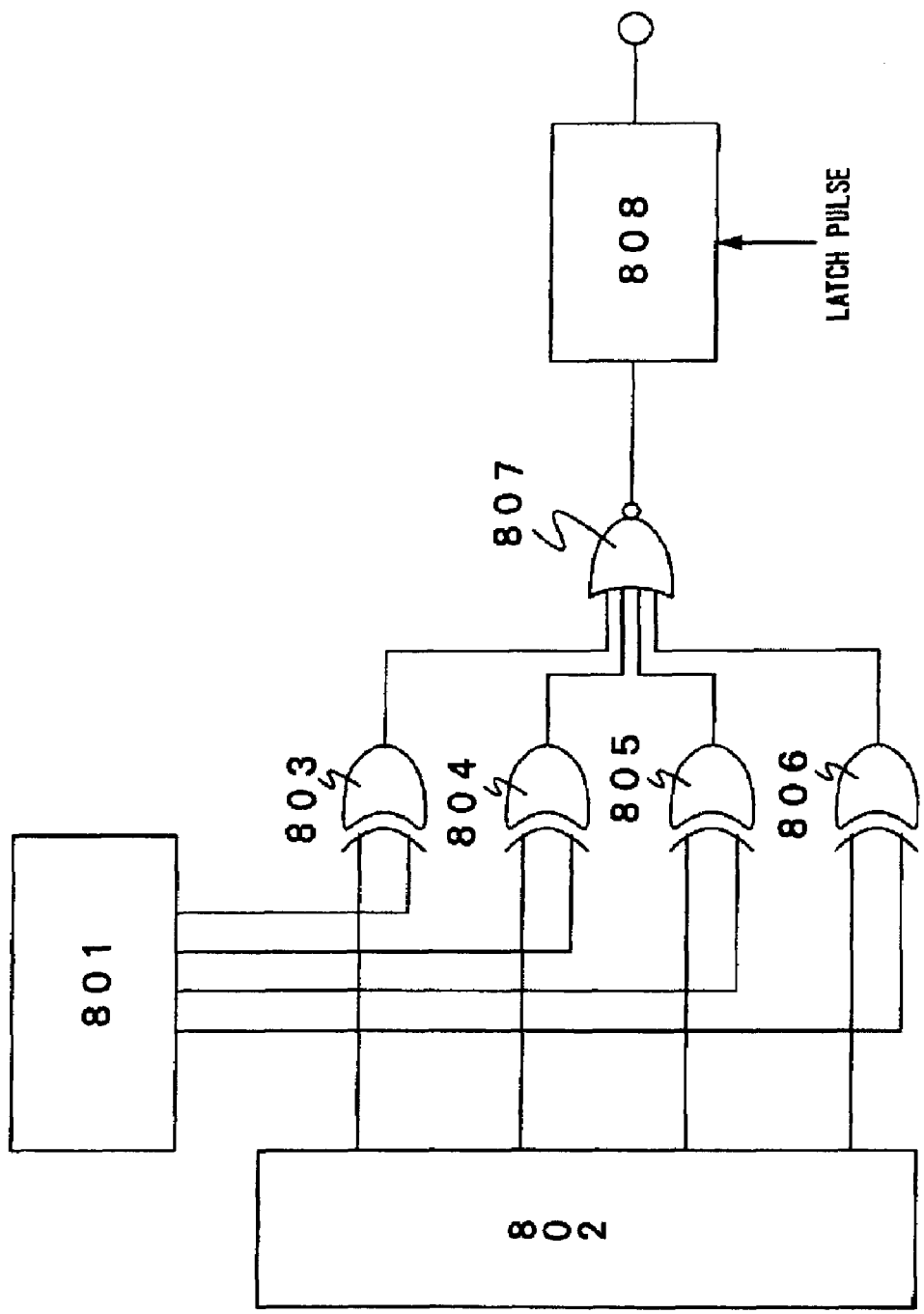
FIG. 8 is a circuit diagram of the an address comparator used in the invention.
Figure 9A:
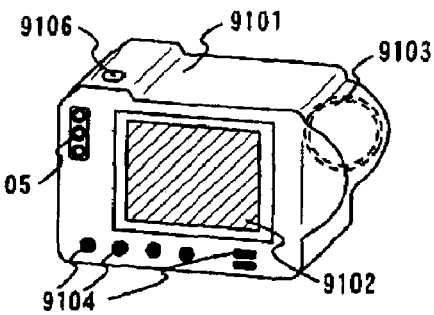
FIGS. 9A-9G show electronic devices using the semiconductor device of the invention.
Figure 9B:
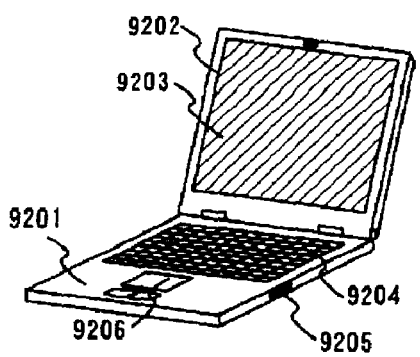
Figure 9C:
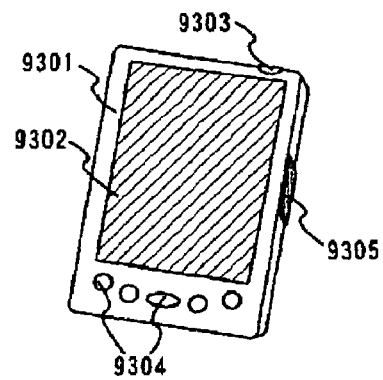
Figure 9D:
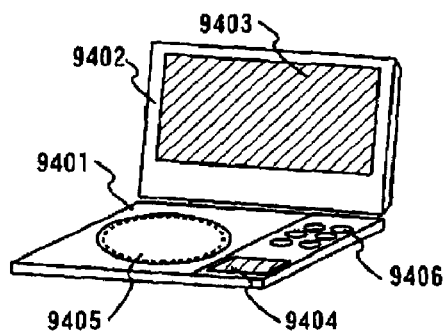
Figure 9E:
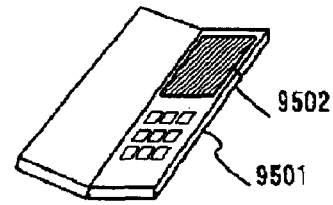
Figure 9F:
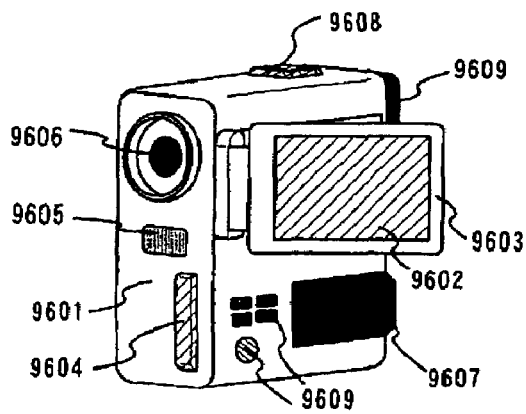
Figure 9G:
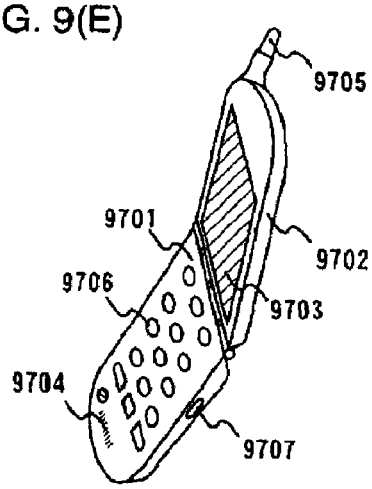
Figure 11:
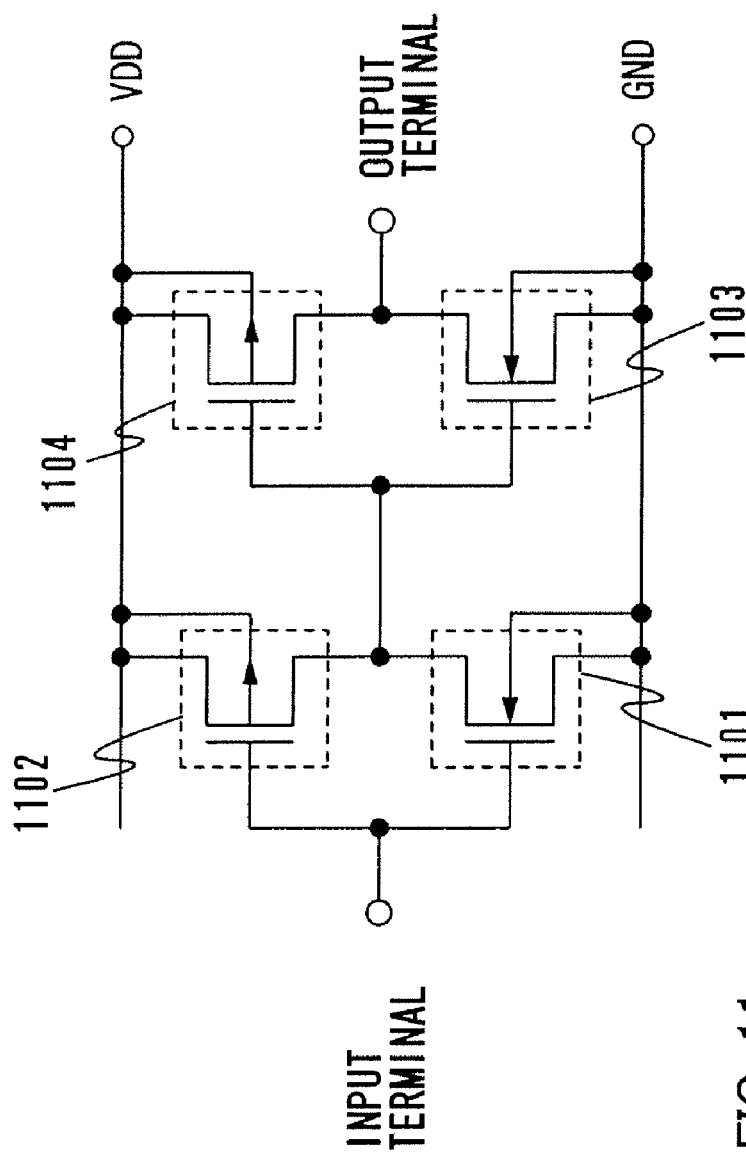
FIG. 11 shows an inverter circuit of a conventional semiconductor device.
Figure 12:
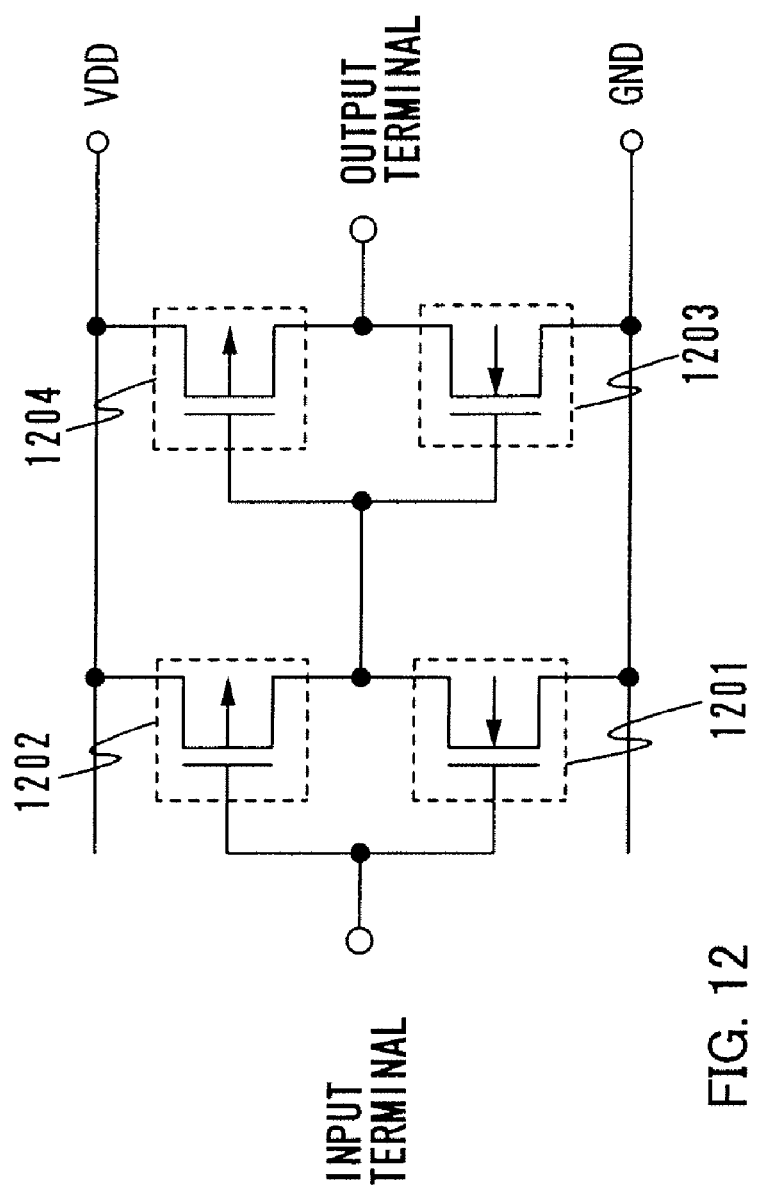
FIG. 12 shows an inverter circuit of a conventional semiconductor device.
Figure 13:
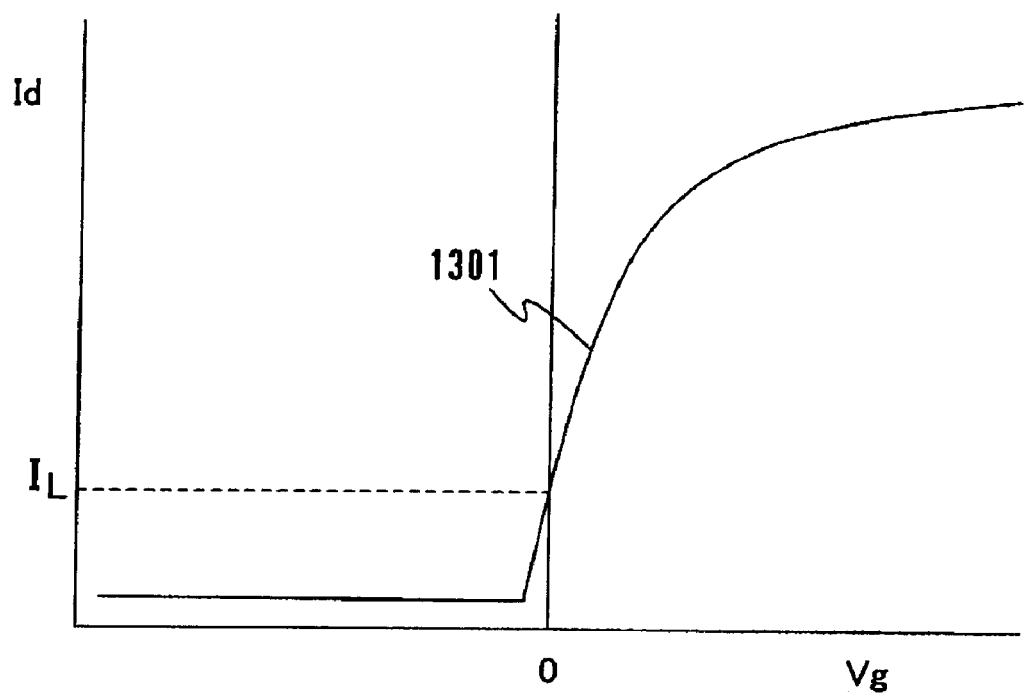
FIG. 13 shows a current characteristic of a transistor used in a conventional semiconductor device.

What is claimed is:

1. A semiconductor device comprising:
   a substrate having an insulating surface;
   a first logic circuit having a first thin film transistor over the substrate;
   a second logic circuit having a second thin film transistor over the substrate;
   an address comparator electrically connected to the first and second logic circuits;
   a counter electrically connected to the address comparator;
   a discrimination circuit electrically connected to the counter;
   a first threshold value control circuit electrically connected to the discrimination circuit; and
   a second threshold value control circuit electrically connected to the discrimination circuit,
   wherein the first thin film transistor is inputted with a first threshold control signal from the first threshold value control circuit, and
   wherein the second thin film transistor is inputted with a second threshold control signal from the second threshold value control circuit.

2. The semiconductor device according to claim 1, wherein the semiconductor device is one selected from the group consisting of a digital camera, a notebook personal computer, a portable information terminal, and an image reproducing device provided with a recording medium.

3. The semiconductor device according to claim 1,
   wherein the discrimination circuit discriminates a first mode or a second mode,
   wherein a first operation frequency in the first mode is higher than a second operation frequency in the second mode.

4. The semiconductor device according to claim 1, wherein the first logic circuit and the second logic circuit are controlled by the first and second threshold value control signals independently.

5. A semiconductor device comprising:
   a substrate having an insulating surface;
   a first logic circuit having a first thin film transistor over the substrate;
   a second logic circuit having a second thin film transistor over the substrate;
   an address comparator electrically connected to the first and second logic circuits;
   a counter electrically connected to the address comparator;
   a discrimination circuit electrically connected to the counter;
   a first threshold value control circuit electrically connected to the discrimination circuit; and
   a second threshold value control circuit electrically connected to the discrimination circuit,
   wherein the first thin film transistor comprises a first gate electrode and a second gate electrode inputted with a first threshold control signal from the first threshold value control circuit, and wherein the second thin film transistor comprises a third gate electrode and a fourth gate electrode inputted with a second threshold control signal from the second threshold value control circuit.

6. The semiconductor device according to claim 5, wherein a semiconductor film is provided over the first gate electrode and the second gate electrode is provided over the semiconductor film.

7. The semiconductor device according to claim 5, wherein the semiconductor device is one selected from the group consisting of a digital camera, a notebook personal computer, a portable information terminal, and an image reproducing device provided with a recording medium.

8. The semiconductor device according to claim 5, wherein the discrimination circuit discriminates a first mode or a second mode, wherein a first operation frequency in the first mode is higher than a second operation frequency in the second mode.

9. The semiconductor device according to claim 5, wherein a semiconductor film is provided over the third gate electrode and the fourth gate electrode is provided over the semiconductor film.

10. The semiconductor device according to claim 5, wherein the first logic circuit and the second logic circuit are controlled by the first and second threshold value control signals independently.

11. A semiconductor device comprising:
a substrate having an insulating surface;
a first logic circuit having a first thin film transistor over the substrate;
a second logic circuit having a second thin film transistor over the substrate;
an address comparator electrically connected to the first and second logic circuits;
a counter electrically connected to the address comparator;
a discrimination circuit electrically connected to the counter; and
a first threshold value control circuit electrically connected to the discrimination circuit; and
a second threshold value control circuit electrically connected to the discrimination circuit,
wherein the first thin film transistor is electrically connected to the first threshold value control circuit,
wherein the second thin film transistor is electrically connected to the second threshold value control circuit, and
wherein the first logic circuit and the second logic circuit are controlled by the first and second threshold value control circuits independently.

12. The semiconductor device according to claim 11, wherein the semiconductor device is one selected from the group consisting of a digital camera, a notebook personal computer, a portable information terminal, and an image reproducing device provided with a recording medium.

13. The semiconductor device according to claim 11, wherein the discrimination circuit discriminates a first mode or a second mode, wherein a first operation frequency in the first mode is higher than a second operation frequency in the second mode.

14. A semiconductor device comprising:
a substrate having an insulating surface;
a first logic circuit having a first thin film transistor over the substrate;
a second logic circuit having a second thin film transistor over the substrate;
an address comparator electrically connected to the first and second logic circuits;
a counter electrically connected to the address comparator;
a discrimination circuit electrically connected to the counter; and
a first threshold value control circuit electrically connected to the discrimination circuit; and
a second threshold value control circuit electrically connected to the discrimination circuit,
wherein the first thin film transistor comprises a first gate electrode and a second gate electrode, the second gate electrode being electrically connected to the first threshold value control circuit,
wherein the second thin film transistor comprises a third gate electrode and a fourth gate electrode, the fourth gate electrode being electrically connected to the second threshold value control circuit, and
wherein the first logic circuit and the second logic circuit are controlled by the first and second threshold value control circuits independently.

15. The semiconductor device according to claim 14, wherein the semiconductor device is one selected from the group consisting of a digital camera, a notebook personal computer, a portable information terminal, and an image reproducing device provided with a recording medium.

16. The semiconductor device according to claim 14, wherein the discrimination circuit discriminates a first mode or a second mode, wherein a first operation frequency in the first mode is higher than a second operation frequency in the second mode.

17. The semiconductor device according to claim 14, wherein a semiconductor film is provided over the first gate electrode and the second gate electrode is provided over the semiconductor film.

18. The semiconductor device according to claim 14, wherein a semiconductor film is provided over the third gate electrode and the fourth gate electrode is provided over the semiconductor film.

* * * * *